US011139842B2

(12) United States Patent
Farzan

(10) Patent No.: US 11,139,842 B2
(45) Date of Patent: Oct. 5, 2021

(54) TRANSMIT DRIVER ARCHITECTURE

(71) Applicant: Rambus Inc., Sunnyvale, CA (US)

(72) Inventor: Kamran Farzan, Toronto (CA)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 16/810,200

(22) Filed: Mar. 5, 2020

(65) Prior Publication Data

US 2020/0287576 A1 Sep. 10, 2020

Related U.S. Application Data

(60) Provisional application No. 62/814,465, filed on Mar. 6, 2019.

(51) Int. Cl.
*H04B 1/04* (2006.01)
*H03M 1/66* (2006.01)
*H04L 27/04* (2006.01)

(52) U.S. Cl.
CPC .............. *H04B 1/04* (2013.01); *H03M 1/662* (2013.01); *H04L 27/04* (2013.01)

(58) Field of Classification Search
CPC .......... H03M 1/662; H04B 1/04; H04L 27/04; H04L 25/028
USPC ........................................................ 375/300
See application file for complete search history.

(56) References Cited

U.S. PATENT DOCUMENTS 8,878,568 B1    11/2014  Farzan et al.
2007/0041468 A1*  2/2007  Dally ................ H04L 25/03343
                                                         375/295

OTHER PUBLICATIONS

Christian Menolfi et. al. "A 112Gb/s 2.6pJ/b 8-Tap FFE PAM-4 SST TX in 14nm CMOS" ISSCC 2018 / Session 6 / Ultra-High-Speed Wireline / 6.2.
Kamran Farzan et al. A Low Jitter 2.7mW/Gbps 180Gb/s 12-Lane Transmitter in a 40nm CMOS Technology, 2012 IEEE Electronic ISBN: 978-1-4673-2213-3.
Mohammad Sadegh Jalali et. al. "A 4-Lane 1.25-to-28.05Gb/s Multi-Standard 6pJ/b 40dB Transceiver in 14nm FinFET with Independent TX/RX Rate Support" ISSCC 2018 / Session 6 / Ultra-High-Speed Wireline / 6.3.

* cited by examiner

*Primary Examiner* — Leila Malek
(74) *Attorney, Agent, or Firm* — Womble Bond Dickinson (US) LLP

(57) ABSTRACT

A method and related apparatus for outputting an analog signal are disclosed. A plurality of transmit levels corresponding to respective predetermined equalization levels is provided. A stream of digital signals carrying data is provided. A transmit level from among the plurality of transmit levels based on the digital signals carrying data is selected. The selected transmit level is received, the selected transmit level is converted to an analog signal of the selected transmit level, and the analog signal of the selected transmit level is output over a signal interface.

18 Claims, 4 Drawing Sheets

TRANSMIT DRIVER ARCHITECTURE

CROSS-REFERENCE TO RELATED APPLICATIONS

This application claims the benefit of U.S. Provisional Patent Application No. 62/814,465, filed Mar. 6, 2019, the entire contents of which are hereby incorporated by reference herein.

BACKGROUND

The increasing demand for data bandwidth has driven high-speed serial link standards to change to multi-level pulse-amplitude modulation (PAM) signaling. Die to Die and ultra short reach (USR) application may have stringent area and power consumption requirements. Conventional transmit (TX) drivers may not satisfy the stringent area and power consumption requirements. For example, a conventional digital to analog converter (DAC) based TX driver has an output stage that is desirable at 100 Gb/s and higher data rates because the output stage has a lowest number of cells connected to the driver outputs and consequently minimal capacitive load at the driver outputs. Also, for the conventional DAC based TX driver, transmit equalization (TXEQ) is handled in digital by a digital signal processing (DSP) block that can calculate the input bit code to the DAC. However, the conventional DAC based TX driver may require one serializer for every bit of the DAC. For example a 5-bit DAC may require 5 serializers to convert 320 (5×64) bit into 5 full-rate signals. The serializers may need a wide digital interface, such as a 320 bit wide digital interface. Therefore, the conventional DAC based TX driver may significantly increase the power and area of design and make it unsuitable for the USR application such as the 112 Gb/s USR application.

On the other hand, a conventional tap-delay block based TX driver may require a lower number of serializers and lower area for the DPL/AFE interface. However, the conventional tap-delay block based TX driver may require a tap-delay data generator block that consumes higher power. The power consumption of the tap-delay data generator block and the power overhead of distributing tap delay data to all slices of the TX driver may make the overall power consumption similar to the conventional DAC based TX driver. Moreover, the conventional tap-delay block based TX driver may require many slices to achieve the desired resolution for amplitude and transmit equalization control, which may result in larger capacitive load at the driver outputs. Thus, the conventional tap-delay block based TX driver also may not be suitable for the USR application.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
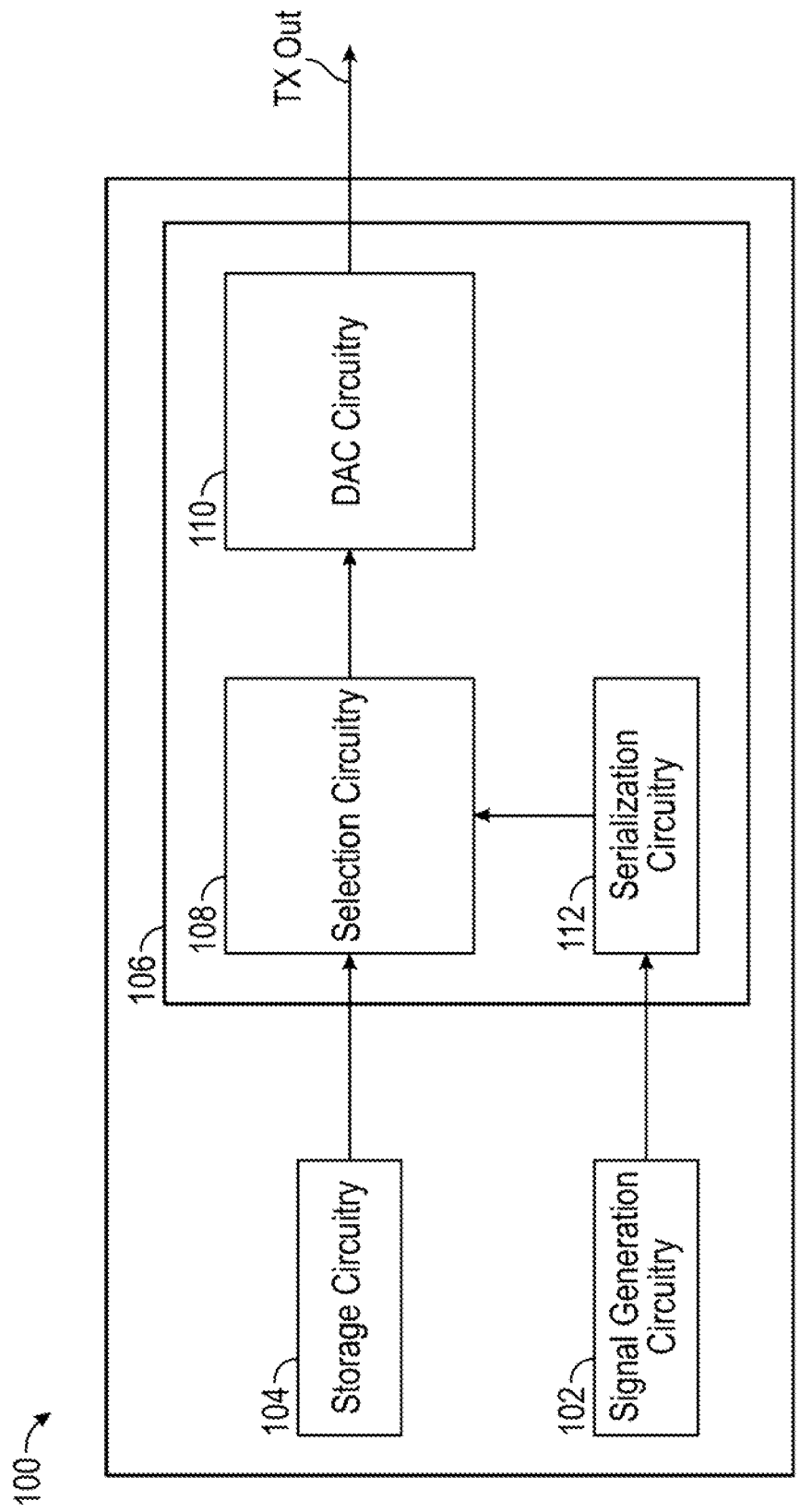
FIG. 1 illustrates a block diagram of an apparatus comprising a TX driver to output an analog signal, according to an embodiment.

In the following description, various aspects of the illustrative embodiments will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative embodiments. In other instances, well-known features are omitted or simplified in order not to obscure the illustrative embodiments.

Embodiments of the present disclosure can receive a stream of digital data and use logic to select one of a set of programmable transmit levels based on each value of the digital data. The selected signal level of the programmable transmit levels is used to generate an output analog signal to be transmitted to an external receiver. An apparatus can include selection circuitry such as multiplexers with the set of programmable transmit levels as inputs, and the stream of digital data can be used as control signals of the multiplexers. The programmable transmit levels can be programmed into a set of registers and the register outputs can be provided to the inputs of the multiplexers. Embodiments of the present disclosure can provide a transmit (TX) driver architecture that has a digital interface with a low area and an output stage that has a relatively low number of cells connected to the driver outputs. Thus, embodiments of the present disclosure can provide a TX driver architecture to achieve a lower area, lower power, and lower capacitance at driver outputs as compared to various alternative techniques.

In one embodiment, an apparatus is provided. The apparatus comprises: signal generation circuitry to provide a stream of digital signals carrying data; storage circuitry to provide a plurality of transmit levels corresponding to respective predetermined equalization levels; selection circuitry to select a transmit level from among the plurality of transmit levels based on the digital signals carrying data; and digital-to-analog converter (DAC) circuitry configured to receive the selected transmit level, convert the selected transmit level to an analog signal of the selected transmit level, and output the analog signal of the selected transmit level over a signal interface.

In one embodiment, a method is provided. The method comprises: providing a plurality of transmit levels corresponding to respective predetermined equalization levels by storage circuitry; providing a stream of digital signals carrying data by signal generation circuitry; selecting a transmit level from among the plurality of transmit levels based on the digital signals carrying data by selection circuitry; and receiving the selected transmit level, converting the selected transmit level to an analog signal of the selected transmit level, and outputting the analog signal of the selected transmit level over a signal interface by digital-to-analog converter (DAC) circuitry.

FIG. 1 illustrates a block diagram of an apparatus comprising a TX driver to output an analog signal. As shown in FIG. 1, in one embodiment, the apparatus 100 includes signal generation circuitry 102, storage circuitry 104 and a TX driver 106. It should also be understood that the apparatus 100 may include one or more additional or alternative components than those shown in FIG. 1.

In one embodiment, as shown in FIG. 1, the TX driver 106 includes selection circuitry 108, DAC circuitry 110 and serialization circuitry 112. The signal generation circuitry 102 provides a stream of digital signals carrying data. For example, the stream of digital signals may carry 64 bits of data at a basic data rate. In one example, the stream of digital signals may carry the 64 bits of data with four-level pulse amplitude (PAM4) modulation for USR application such as the 112 Gb/s USR application. The signal generation circuitry 102 can provide the stream of digital signals to the TX driver 106, or more specifically to the serialization circuitry 112. In some embodiments, the signal generation circuitry 102 may provide multiple streams of digital signals carrying data.

In one embodiment, as shown in FIG. 1, the serialization circuitry 112 serializes the stream of digital signals and transmits the serialized stream of digital signals to the selection circuitry 108. For example, the stream of digital signals can be serialized by the serialization circuitry 112 to provide digital signals with quarter-rate, half-rate, full-rate or other data rates. The serialization circuitry 112 can include one or more serializers. In one embodiment, the serialization circuitry 112 includes only two serializers. The stream of digital signals comprises a first digital signal carrying least significant bits (LSB) of the data and a second digital signal carrying most significant bits (MSB) of the data. The first and second digital signals can be serialized by the two serializers respectively.

In one embodiment, the storage circuitry 104 provides a plurality of transmit levels to the TX driver 106, or more specifically to the selection circuitry 108. The plurality of transmit levels corresponds to respective predetermined equalization levels. The plurality of transmit levels indicates different predetermined equalization levels to generate an equalized analog signal carrying the data. In one embodiment, each of the plurality of transmit levels is a respective input signal to the selection circuitry 108. The selection circuitry 108 receives the plurality of transmit levels and selects a transmit level from among the plurality of transmit levels based on the digital signals carrying data. That is, based on the stream of digital signals, the selection circuitry 108 knows what equalization level should be applied and selects the transmit level corresponding to that equalization level. In one embodiment, the plurality of transmit levels is programmable and programmed into a set of registers of the storage circuitry 104. And outputs from the set of registers are provided to inputs of the selection circuitry 108. In some examples, the set of registers can store different transmit levels predetermined by users of the apparatus 100. For example, a user may need 3 dB and 4 dB transmit equalizations in different scenarios, and thus the user can program transmit levels for 3 dB and 4 dB transmit equalizations into the set of registers. In other examples, the stored transmit levels may have a preset of values for different applications such as for different speed modes in USR applications. In further examples, the user may require new transmit equalizations. Then the user can reprogram and update new transmit levels corresponding to the new required transmit equalizations into the set of registers.

In one embodiment, the selection circuitry 108 includes one or more multiplexers. The stream of digital signals is provided as control signals or selection signals of the one or more multiplexers. Each of the one or more multiplexers can select a transmit level from among a plurality of transmit levels based on the control signals of the one or more multiplexers. In one embodiment, the control signals include the stream of digital signals and further include one or more post-cursor signals or one or more precursor signals. The post-cursor signals are time-delayed relative to the stream of digital signals, i.e., the post-cursor signals include a time-delayed version (e.g., delayed by one or more unit intervals) of the stream of digital signals. The precursor signals are time-advanced relative to the stream of digital signals, i.e., the precursor signals include a time-advanced version (e.g., advanced by one or more unit intervals) of the stream of digital signals. The post-cursor signals and the precursor signals can be used to control the multiplexers to select a transmit level from among a plurality of transmit levels.

In one embodiment, the DAC circuitry 110 receives the selected transmit level from the selection circuitry 108. The DAC circuitry 110 converts the selected transmit level to an analog signal of the selected transmit level. That is, the DAC circuitry 110 converts the stream of digital signals to an analog signal carrying the data. The analog signal is equalized by the equalization level indicated by the selected transmit level. The DAC circuitry 110 outputs the equalized analog signal of the selected transmit level over a signal interface to an external receiver, as indicated by "TX OUT" in FIG. 1.

In one embodiment, the selection circuitry 108 includes one or more multiplexers. The selected transmit level from each of the one or more multiplexers is a respective input signal to the DAC circuitry 110. A number of the one or more multiplexers is determined by a resolution of the DAC circuitry 110. For example, the DAC circuitry 100 may include a DAC with a resolution of 5 bits, and thus the selection circuitry 108 includes five multiplexers. Each of the five multiplexers can provide a selected transmit level corresponding to one bit of the 5 bits. In one embodiment, the DAC circuitry 100 includes a number of buffers or slices. The number of buffers or slices is equal to the number of the one or more multiplexers. For example, if the selection circuitry 108 includes five multiplexers, then the DAC circuitry 100 includes five buffers or slices. Each of the buffers is connected to a respective multiplexer.

Figure 2:
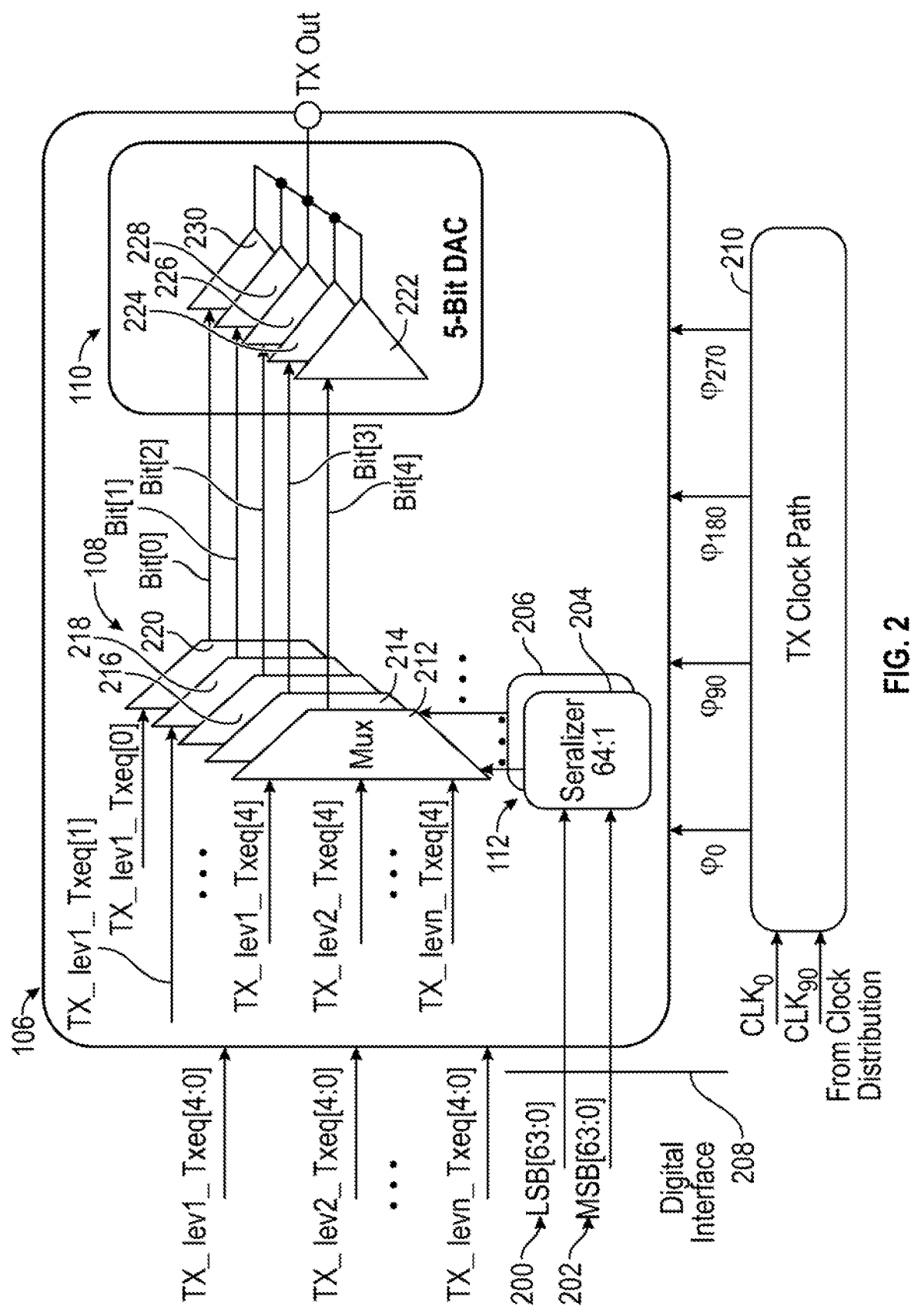
FIG. 2 illustrates the TX driver of FIG. 1, according to one embodiment.

FIG. 2 illustrates the TX driver 106 of FIG. 1, according to one embodiment. As shown in FIG. 2, the TX driver 106 includes selection circuitry 108, DAC circuitry 110 and serialization circuitry 112. In one embodiment, the serialization circuitry 112 includes two 64:1 serializers 204 and 206. The selection circuitry 108 includes five multiplexers 212, 214, 216, 218 and 220. The DAC circuitry 110 includes a DAC with a resolution of 5 bits and five buffers or slices 222, 224, 226, 228 and 230. Each of the five buffers is connected to a respective multiplexer. As described above, the number of multiplexers (e.g., 5) is determined by the resolution of the DAC (e.g., a resolution of 5 bits). The number of buffers or slices (e.g., 5) is equal to the number of the multiplexers (e.g., 5).

In one embodiment, as shown in FIG. 2, a stream of digital signals carrying data is provided to the two 64:1 serializers 204 and 206 through a digital interface 208. The stream of digital signals includes a first digital signal 200 carrying LSB of the data and a second digital signal 202 carrying MSB of the data. The digital signals 200 and 202 can be provided by the signal generation circuitry 102 as described above. In one example, the first digital signal 200 can include 64 parallel bits of LSB of the data at a basic data rate, and the second digital signal 202 can include 64 parallel bits of MSB of the data at a basic data rate. The two serializers 204 and 206 can serialize the first and second digital signals respectively to generate two serialized digital signals with full-rate. For example, the serializer 204 can serialize the first digital signal 200 to generate serialized digital signals with full-rate, and the serializer 206 can serialize the second digital signal 202 generate serialized digital signals with full-rate. In one embodiment, the serialization circuitry 112 includes only two serializers 204 and 206.

In one embodiment, as shown in FIG. 2, the two serializers 204 and 206 can provide the serialized digital signals to each of the five multiplexers 212-220 as control signals or selection signals of the five multiplexers. The control signals may only include the serialized digital signals at a unit interval. For example, at a unit interval, the control signals may only include two bits from the two serializers 204 and 206 respectively. In one embodiment, the control signals include the serialized digital signals and further include one or more post-cursor signals or one or more precursor signals as described above. In one example, the one or more post-cursor signals or one or more precursor signals can be generated by the TX clock path 210 through phase control of the serialized digital signals using clock signals. The clock signals can be provided from clock distribution. For example, at a unit interval t, the serializer 204 outputs a digital signal lsb(t). A post-cursor signal lsb(t−1) and a precursor signal lsb(t+1) can be provided by the TX clock path 210. Similarly, the serializer 206 outputs a digital signal msb(t). A post-cursor signal msb(t−1) and a precursor signal msb(t+1) can be provided by the TX clock path 210. The control signals provided to the five multiplexers can include lsb(t) and msb(t), and further include one or more of lsb(t−1), lsb(t+1), msb(t−1) and msb(t+1). In this example, the two serializers 204 and 206 can provide at most six digital signals to the five multiplexers as control signals.

In one embodiment, as shown in FIG. 2, a plurality of transmit levels (e.g., n transmit levels) TX_lev1_Txeq[4:0], TX_lev2_Txeq[4:0], . . . , TX_levn_Txeq[4:0] are provided to the five multiplexers 212-220. Each of the n transmit levels includes a bit code such as a 5-bit code for a DAC with a resolution of 5 bits. The plurality of transmit levels can be provided by the storage circuitry 104 as described above. The plurality of transmit levels can be predetermined by users of the apparatus 100. The plurality of transmit levels can be programmable and programmed into a set of n registers of the storage circuitry 104. Each of the n registers stores a respective transmit level of the n transmit levels. Outputs from the set of n registers are provided to inputs of each of the five multiplexers 212-220.

In one embodiment, the number of transmit levels can depend on the control signals of the five multiplexers, and thereby can depend on the serialized digital signals from the two serializers 204 and 206. For example, for the case of non-return-to-zero (NRZ) TX driver with only one tap, there are only 4 possible transmit levels: positive peak (01 transition), positive de-emphasized level (11 transition), negative peak (10 transition) and negative de-emphasized level (00 transition). Thus, for a DAC with a resolution of 5 bits, there are four transmit levels and each of the four transmit levels includes a 5-bit code. The five multiplexers 212-220 are five 4:1 multiplexers and select one transmit level from the four transmit levels. In this example, the control signals may only include the two serialized digital signals at a unit time interval. In other examples, the control signals can further include one or more post-cursor signals or one or more precursor signals as described above. For example, when the two serializers 204 and 206 provide six digital signals to the five multiplexers as control signals, there can be at most 64 transmit levels provided to the five multiplexers 212-220 and the five multiplexers 212-220 can be 64:1 multiplexers. In another example, 8:1 multiplexers can be used to implement a driver with one precursor signal and a driver with one post-cursor signal as two NRZ drivers. The two NRZ drivers can be combined at the final output.

In one embodiment, as shown in FIG. 2, each of the n transmit levels TX_lev1_Txeq[4:0], TX_lev2_Txeq[4:0], . . . , TX_levn_Txeq[4:0] is a respective input signal to each of the five n:1 multiplexers 212-220. Each of the five multiplexers 212-220 receives one bit from the 5-bit code of each of then transmit levels. That is, each of the five multiplexers 212-220 receives n bits in total. For example, the multiplexer 212 receives the last bit TX_lev1_Txeq[4], TX_lev2_Txeq[4], . . . , TX_levn_Txeq[4] from the 5-bit code of each of the n transmit levels. Similarly, the multiplexer 220 receives the first bit TX_lev1_Txeq[0], TX_lev2_Txeq[0], . . . , TX_levn_Txeq[0] from the 5-bit code of each of the n transmit levels. Each of the five multiplexers 212-220 selects one bit from the received n bits based on the control signals of the five multiplexers. The control signals including the digital signals carrying the data can indicate the needed equalization level and can determine the selection logic of the five multiplexers 212-220. Thus, each of the five multiplexers 212-220 can select one bit from the received n bits corresponding to the needed equalization level.

In one embodiment, as shown in FIG. 2, the selected 5 bits (e.g., bit[0], bit[1], bit[2], bit[3], bit[4]) correspond to the selected transmit level. Each of the selected 5 bits is provided as a respective input signal to the DAC circuitry 110. The selected 5 bits are respectively provided to the five buffers or slices 222-230 in the DAC circuitry 110. The selected transmit level (e.g., the selected 5 bits) can indicate the needed equalization level. The DAC circuitry 110 applies the needed equalization level to generate an equalized analog signal of the selected transmit level, and outputs the equalized analog signal of the selected transmit level over a signal interface to an external receiver, as indicated by "TX OUT" in FIG. 2.

Figure 3:
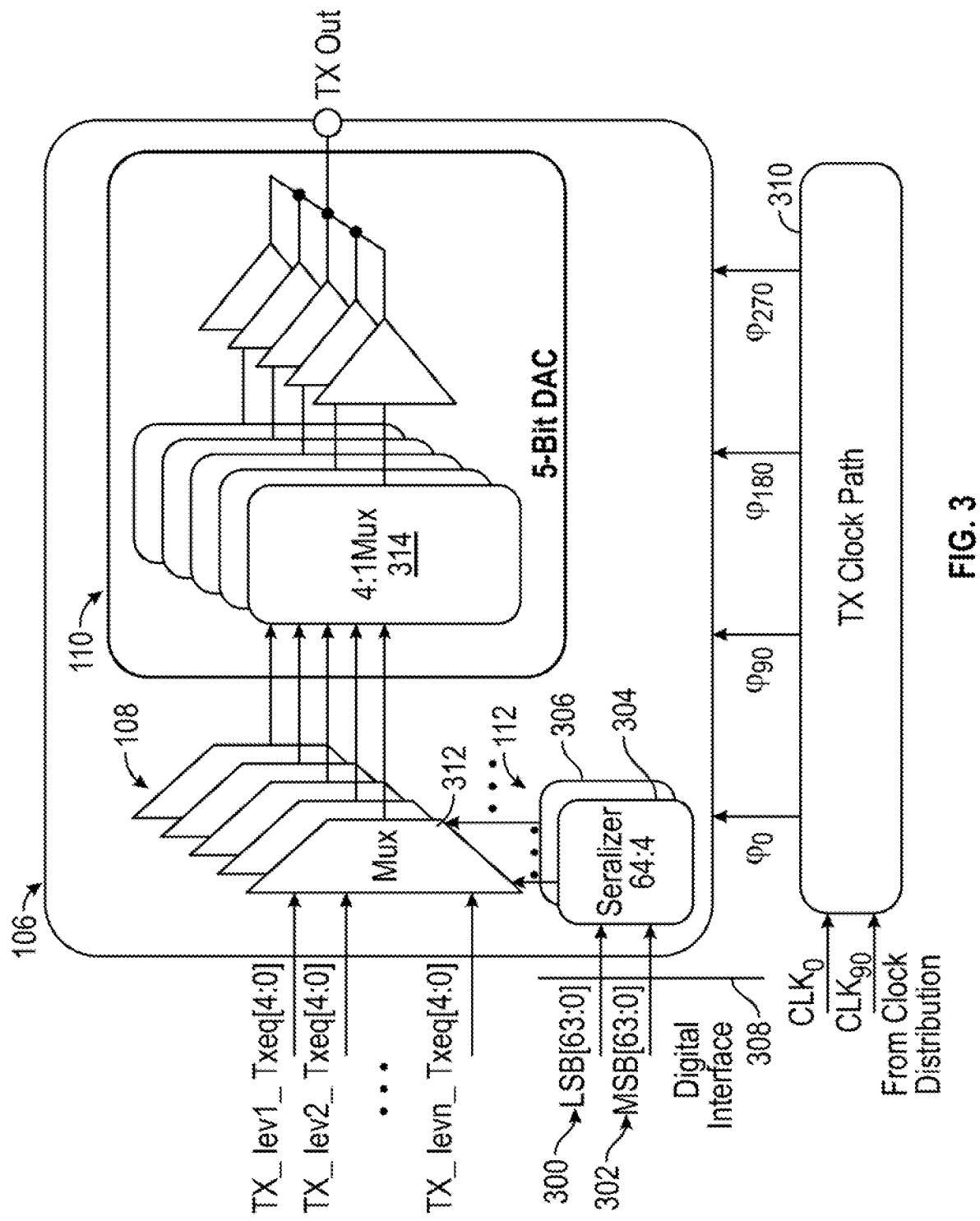
FIG. 3 illustrates the TX driver of FIG. 1, according to another embodiment.

FIG. 3 illustrates the TX driver 106 of FIG. 1, according to another embodiment. As shown in FIG. 3, the TX driver 106 includes selection circuitry 108, DAC circuitry 110 and serialization circuitry 112. In one embodiment, the serialization circuitry 112 includes two 64:4 serializers 304 and 306. The selection circuitry 108 includes five n:1 multiplexers with four quarter-rate outputs similarly as described above in FIG. 2. The DAC circuitry 110 includes a DAC with a resolution of 5 bits and five buffers or slices similarly as described above in FIG. 2. Additionally, the DAC circuitry 110 includes five 4:1 multiplexers. Each of the five 4:1 multiplexers is connected to a respective multiplexer in the selection circuitry 108 and is connected to a respective buffer in the DAC circuitry 110.

In one embodiment, as shown in FIG. 3, a stream of digital signals is provided to the two 64:4 serializers 304 and 306 through a digital interface 308. The stream of digital signals includes a first digital signal 300 carrying LSB of the data and a second digital signal 302 carrying MSB of the data. In one example, the first digital signal 300 can include 64 parallel bits of LSB of the data at a basic data rate, and the second digital signal 302 can include 64 parallel bits of MSB of the data at a basic data rate. The two serializers 304 and 306 can serialize the first and second digital signals respectively to generate serialized digital signals with quarter-rate. For example, the serializer 304 can serialize the first digital signal 300 to generate four serialized digital signals with quarter-rate, and the serializer 306 can serialize the second digital signal 302 to generate four serialized digital signals with quarter-rate.

In one embodiment, as shown in FIG. 3, the two serializers 304 and 306 can provide the serialized digital signals with quarter-rate to each of the five multiplexers in the selection circuitry 108 as control signals or selection signals of the five multiplexers. Similarly as described above in FIG. 2, each of the five multiplexers in the selection circuitry 108 selects one transmit level from among the plurality of transmit levels based on the control signals and thereby the digital signals carrying data. Each of the five multiplexers in the selection circuitry 108 outputs 4 selected bits with quarter-rate. And the 4 selected bits with quarter-rate are provided to the respectively connected 4:1 multiplexer to generate one selected bit with full-rate corresponding to the selected transmit level. For example, the n:1 multiplexer 312 can output 4 selected bits with quarter-rate. And the 4:1 multiplexer 314 receives the 4 selected bits with quarter-rate to generate one selected bit with full-rate corresponding to the selected transmit level. The selected bit with full-rate from each of the five 4:1 multiplexers are respectively provided to the five buffers or slices in the DAC circuitry 110. The selected transmit level (e.g., the selected 5 bits with full-rate) can indicate the needed equalization level. The DAC circuitry 110 applies the needed equalization level to generate an equalized analog signal of the selected transmit level, and outputs the equalized analog signal of the selected transmit level over a signal interface to an external receiver, as indicated by "TX OUT" in FIG. 3.

The above descriptions with reference to FIG. 2 and FIG. 3 only describe some embodiments of the present disclosure. In other embodiments, the TX driver 106 may include a different number of serializers or serializers having a different serialization ratio. For example, the serializers can serialize the stream of digital signals to generate serialized digitals signals with half-rate, ⅛-rate or other rates. In other embodiments, the control signals can include different post-cursor signals and/or precursor signals. In other embodiments, the TX driver 106 may include a different number of multiplexers or multiplexers having a different selection ratio. In other embodiments, the TX driver 106 may include DAC circuitry with a different resolution such as a resolution of 8 bits.

Figure 4:
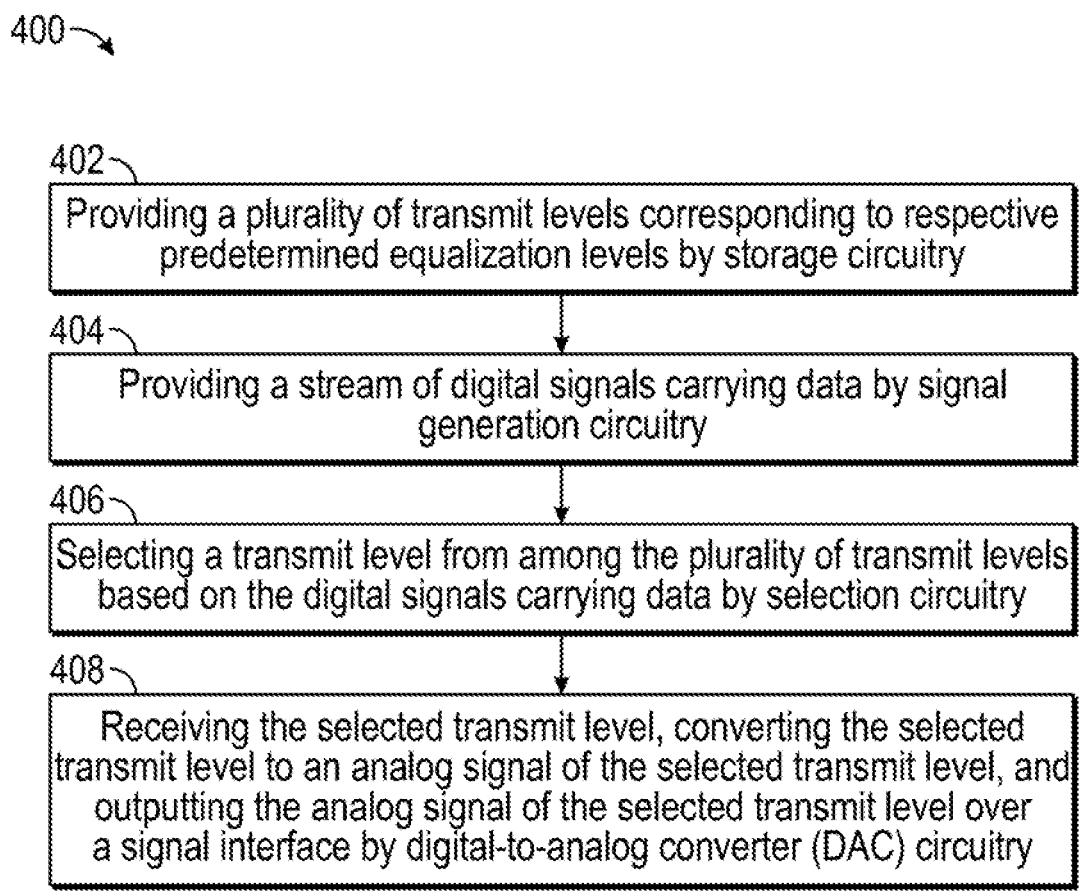
FIG. 4 is a flow diagram of a method for outputting an analog signal, according to an embodiment.

FIG. 4 illustrates a flow diagram of a method for outputting an analog signal, according to an embodiment. As shown in FIG. 4, the method 400 starts from block 402. At block 402, the method 400 comprises providing a plurality of transmit levels corresponding to respective predetermined equalization levels by storage circuitry 104. For example, the storage circuitry 104 can provide a plurality of transmit levels, e.g., n transmit levels TX_lev1_Txeq[4:0], TX_lev2_Txeq[4:0], . . . , TX_levn_Txeq[4:0]. The plurality of transmit levels indicates different predetermined equalization levels to generate an equalized analog signal carrying the data. The plurality of transmit levels can be predetermined by users of the apparatus 100.

At block 404, the method 400 comprises providing a stream of digital signals carrying data by signal generation circuitry 102. For example, the signal generation circuitry 102 can provide a stream of digital signals carrying data. In one embodiment, the stream of digital signals comprises a first digital signal carrying LSB of the data and a second digital signal carrying MSB of the data. For example, as shown in FIG. 2, the stream of digital signals includes a first digital signal 200 carrying LSB of the data and a second digital signal 202 carrying MSB of the data.

At block 406, the method 400 comprises selecting a transmit level from among the plurality of transmit levels based on the digital signals carrying data by selection circuitry 108. For example, the selection circuitry 108 can select a transmit level from n transmit levels. In one embodiment, each of the plurality of transmit levels is a respective input signal to the selection circuitry 108.

In one embodiment, the selection circuitry 108 comprises one or more multiplexers. Providing the stream of digital signals at block 402 comprises providing the stream of digital signals as control signals of the one or more multiplexers. For example, the selection circuitry 108 can include five n:1 multiplexers 212-220 as shown in FIG. 2. In one embodiment, the method 400 further comprises serializing the stream of digital signals and transmitting the serialized stream of digital signals to the selection circuitry 108 by serialization circuitry 112. For example, as shown in FIG. 2, the serializer 204 can serialize the first digital signal 200 and the serializer 206 can serialize the second digital signal 202. The serialized stream of digital signals can be provided to each of the five n:1 multiplexers 212-220 as control signals.

At block 408, the method 400 comprises receiving the selected transmit level, converting the selected transmit level to an analog signal of the selected transmit level, and outputting the analog signal of the selected transmit level over a signal interface by DAC circuitry 110. For example, as shown in FIG. 2, the DAC circuitry 110 includes a DAC with a resolution of 5 bits and five buffers or slices 222, 224, 226, 228 and 230. The DAC circuitry 110 can receive the selected 5 bits corresponding to the selected transmit level from the five multiplexers 212-220. The selected transmit level from each of the five multiplexers is a respective input signal to the DAC circuitry 110. The selected transmit level (e.g., the selected 5 bits) can indicate the needed equalization level. The DAC circuitry 110 can apply the needed equalization level to generate an equalized analog signal of the selected transmit level, and output the equalized analog signal of the selected transmit level over a signal interface to an external receiver, as indicated by "TX OUT" in FIG. 2.

In one embodiment, the plurality of transmit levels is programmable and programmed into a set of registers of the storage circuitry 104. The method 400 further comprising receiving the programmed plurality of transmit levels from the set of registers at the selection circuitry 108. For example, n transmit levels can be programmable and programmed into a set of n registers of the storage circuitry 104. Each of the n registers stores a respective transmit level of the n transmit levels. The selection circuitry 108, or more specifically each of the one or more multiplexers can receive the programmed n transmit levels from the set of n registers.

Embodiments described in the present disclosure can have a lower number (e.g., only 2) of serializers such that the area for the digital interface 208 or 308 can be reduced comparing to the conventional DAC based TX driver. And power consumption of serializers can be also reduced comparing to the conventional DAC based TX driver. On the other hand, embodiments described in the present disclosure can avoid requiring a tap-delay data generator block and have a low number (e.g., 5) of buffers or slices comparing to the conventional tap-delay block based TX driver. Thus, power consumption and capacitive load at the driver outputs can be reduced comparing to the conventional tap-delay block based TX driver. Therefore, embodiments described in the present disclosure can provide a TX driver architecture to achieve a lower area, power, and capacitance at driver outputs. Accordingly, embodiments described in the present disclosure can be suitable for 112 Gb/s USR application.

The above description of illustrated embodiments of the disclosure, including what is described in the Abstract, is not intended to be exhaustive or to limit the disclosure to the precise forms disclosed. While specific embodiments of, and examples for, the disclosure are described herein for illustrative purposes, various equivalent modifications are possible within the scope of the disclosure, as those skilled in the relevant art will recognize. Other embodiments may have layers in different orders, additional layers or fewer layers than the illustrated embodiments.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer deposited above or over or under another layer may be directly in contact with the other layer or may have one or more intervening layers. Moreover, one layer deposited between two layers may be directly in contact with the two layers or may have one or more intervening layers. In contrast, a first layer "on" a second layer is in direct contact with that second layer. Similarly, unless explicitly stated otherwise, one feature deposited between two features may be in direct contact with the adjacent features or may have one or more intervening layers.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. The terms "first," "second," "third," "fourth," etc. as used herein are meant as labels to distinguish among different elements and may not necessarily have an ordinal meaning according to their numerical designation.

What is claimed is:

1. An apparatus, comprising:
   signal generation circuitry to provide a stream of digital signals carrying data;
   storage circuitry to provide a plurality of transmit levels corresponding to respective predetermined equalization levels;
   serialization circuitry configured to serialize the stream of digital signals;
   selection circuitry to receive the serialized stream of digital signals from the serialization circuitry and select a transmit level from among the plurality of transmit levels based on the serialized stream of digital signals; and
   digital-to-analog converter (DAC) circuitry configured to receive the selected transmit level, convert the selected transmit level to an analog signal of the selected transmit level, and output the analog signal of the selected transmit level over a signal interface.

2. The apparatus of claim 1, wherein the serialization circuitry comprises two serializers.

3. The apparatus of claim 1, wherein the stream of digital signals comprises a first digital signal carrying least significant bits (LSB) of the data and a second digital signal carrying most significant bits (MSB) of the data.

4. The apparatus of claim 1, wherein each of the plurality of transmit levels is a respective input signal to the selection circuitry.

5. The apparatus of claim 1, wherein the selection circuitry comprises one or more multiplexers, and wherein the stream of digital signals is provided as control signals of the one or more multiplexers.

6. The apparatus of claim 5, wherein the control signals further comprise one or more post-cursor signals that are time-delayed relative to at least one of the stream of digital signals or one or more precursor signals that are time-advanced relative to the stream of digital signals.

7. The apparatus of claim 5, wherein the selected transmit level from each of the one or more multiplexers is a respective input signal to the DAC circuitry.

8. The apparatus of claim 5, wherein a number of the one or more multiplexers is determined by a resolution of the DAC circuitry, and wherein the DAC circuitry includes a number of buffers that is equal to the number of the one or more multiplexers.

9. The apparatus of claim 1, wherein the plurality of transmit levels is programmable and programmed into a set of registers of the storage circuitry, and wherein outputs from the set of registers are provided to inputs of the selection circuitry.

10. A method, comprising:
    providing a plurality of transmit levels corresponding to respective predetermined equalization levels by storage circuitry;
    providing a stream of digital signals carrying data by signal generation circuitry;
    serializing the stream of digital signals and transmitting the serialized stream of digital signals to selection circuitry by serialization circuitry;
    selecting a transmit level from among the plurality of transmit levels based on the serialized stream of digital signals by the selection circuitry; and
    receiving the selected transmit level, converting the selected transmit level to an analog signal of the selected transmit level, and outputting the analog signal of the selected transmit level over a signal interface by digital-to-analog converter (DAC) circuitry.

11. The method of claim 10, wherein the serialization circuitry comprises only two serializers.

12. The method of claim 10, wherein the stream of digital signals comprises a first digital signal carrying least significant bits (LSB) of the data and a second digital signal carrying most significant bits (MSB) of the data.

13. The method of claim 10, wherein each of the plurality of transmit levels is a respective input signal to the selection circuitry.

14. The method of claim 10, wherein the selection circuitry comprises one or more multiplexers, and wherein providing the stream of digital signals comprises providing the stream of digital signals as control signals of the one or more multiplexers.

15. The method of claim 14, wherein the control signals further comprise one or more post-cursor signals that are time-delayed relative to at least one of the stream of digital signals or one or more precursor signals that are time-advanced relative to the stream of digital signals.

16. The method of claim 14, wherein the selected transmit level from each of the one or more multiplexers is a respective input signal to the DAC circuitry.

17. The method of claim 14, wherein a number of the one or more multiplexers is determined by a resolution of the DAC circuitry, and wherein the DAC circuitry includes a number of buffers that is equal to the number of the one or more multiplexers.

18. The method of claim 10, wherein the plurality of transmit levels is programmable and programmed into a set of registers of the storage circuitry, and the method further comprising receiving the programmed plurality of transmit levels from the set of registers at the selection circuitry.

* * * * *